(12) United States Patent
Chang et al.

(10) Patent No.: US 6,255,232 B1
(45) Date of Patent: Jul. 3, 2001

(54) METHOD FOR FORMING LOW DIELECTRIC CONSTANT SPIN-ON-POLYMER (SOP) DIELECTRIC LAYER

(75) Inventors: Weng Chang; Yao-Yi Cheng, both of Taipei; Syun-Ming Jang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/248,730

(22) Filed: Feb. 11, 1999

(51) Int. Cl.$^7$ .................. H01L 21/469; H01L 21/4763
(52) U.S. Cl. .................. 438/780; 438/622; 438/623; 438/781
(58) Field of Search .................. 438/780, 781, 438/308, 622, 623

(56) References Cited

U.S. PATENT DOCUMENTS

| | | | |
|---|---|---|---|
| 5,219,792 | * | 6/1993 | Kim et al. ............... 438/631 |
| 5,314,724 | * | 5/1994 | Tsukune et al. ............ 427/489 |
| 5,413,963 | * | 5/1995 | Yen et al. ............... 438/623 |
| 5,503,882 | * | 4/1996 | Dawson ................. 438/763 |
| 5,506,177 | * | 4/1996 | Kishimoto et al. ........... 438/624 |
| 5,512,513 | * | 4/1996 | Machida et al. ............ 438/624 |
| 5,559,055 | | 9/1996 | Chang et al. ............. 437/195 |
| 5,565,384 | | 10/1996 | Havemann ............... 437/228 |
| 5,665,845 | * | 9/1997 | Allman ................. 438/780 |
| 5,723,368 | * | 3/1998 | Cho et al. ............... 438/624 |
| 5,759,886 | * | 6/1998 | Chung ................. 438/231 |
| 5,830,804 | * | 11/1998 | Cleeves et al. ............ 438/672 |
| 5,861,345 | * | 1/1999 | Chou et al. ............... 438/763 |
| 5,866,476 | * | 2/1999 | Choi et al. ............... 438/624 |
| 5,872,402 | * | 2/1999 | Hasegawa ............... 257/758 |
| 5,930,677 | * | 7/1999 | Zheng et al. ............. 438/782 |
| 6,022,802 | * | 2/2000 | Jang ................... 438/656 |

* cited by examiner

Primary Examiner—Stephen D. Meier
Assistant Examiner—Toniae M. Thomas
(74) Attorney, Agent, or Firm—George O. Saile; Stephen B. Ackerman; Stephen G. Stanton

(57) ABSTRACT

A method for forming a dielectric layer upon a substrate within a microelectronics fabrication. There is provided a substrate. There is then formed upon the substrate while employing a low dielectric constant spin-on material a dielectric layer which is subsequently cured at atmospheric pressure at an elevated temperature to stabilize the physical and chemical properties of the low dielectric constant dielectric layer so as to attenuate shrinkage and other changes in those physical, and chemical properties from thermal annealing at sub-atmospheric pressure due to typical further microelectronics fabrication processing steps.

9 Claims, 2 Drawing Sheets

METHOD FOR FORMING LOW DIELECTRIC CONSTANT SPIN-ON-POLYMER (SOP) DIELECTRIC LAYER

BACKGROUND OF THE INVENTION

1. Field of the Invention

This invention relates generally to the field of dielectric layers employed within microelectronics fabrications. More particularly, the invention relates to methods of fabrication of low dielectric constant dielectric layers employed within microelectronics fabrications.

2. Description of the Related Art

Fabrication of microelectronics devices makes effective use of patterned microelectronics conductor layers employed as interconnections for signal and power propagation by separating such conductor layers by means of blanket and/or patterned microelectronics dielectric layers. Advances in speed and performance requirements, along with decreases in dimensions and ground rules for microelectronics devices, have made the requirements placed upon such dielectric layers more stringent with respect to lowering the "relative dielectric constants" of the dielectric layers (i.e. the dielectric constants relative to vacuum). The "relative dielectric constant" of a dielectric layer is hereinafter referred to for brevity as the "dielectric constant" of the dielectric layer. Lower dielectric constant dielectric layers are desirable disposed between and around patterned microelectronics conductor layers within microelectronics fabrications since such lower dielectric constant dielectric layers typically provide microelectronics fabrications with reduced microelectronics fabrication parasitic capacitance and attenuated patterned microelectronics conductor layer crosstalk.

Conventional silicon containing dielectric layers formed of conventional silicon containing dielectric materials such as but not limited to silicon oxide dielectric materials, silicon nitride dielectric materials, and silicon oxynitride dielectric materials typically exhibit dielectric constants within the range of from about 4 to about 8 when formed disposed between and around patterned microelectronics conductor layers. While such conventional silicon containing dielectric layers formed employing conventional silicon containing materials formed by methods conventional in the art of microelectronics fabrication are satisfactory in general for electrically separating patterned microelectronics conductor layers, it is desirable to employ alternate methods and materials for forming dielectric layers having lower dielectric constants.

Of the methods and materials which may be employed for forming lower dielectric constant dielectric layers disposed between and around the patterns of patterned microelectronics conductor layers within microelectronics fabrications. methods which employ dielectric materials with intrinsically low dielectric constants are particularly desirable within the art of microelectronics fabrication. Such alternative low dielectric constant dielectric layers may be formed over microelectronics substrates by spin coating deposition of intrinsically low dielectric constant materials such as but not limited to organic polymer spin-on-polymer (SOP) dielectric materials. Such dielectric layers typically exhibit somewhat lower dielectric constants which range from about 2 to about 3. In particular, organic polymer spin-on-polymer (SOP) dielectric materials which may be employed for forming organic polymer spin-on-polymer (SOP) layers, include but are not limited to polyimide organic polymer spin-on-polymer dielectric materials, poly (arylene ether) organic polymer spin-on-polymer dielectric materials and fluorinated poly (arylene ether) organic polymer spin-on-polymer dielectric materials. Such spin-on-polymer (SOP) dielectric materials are typically thermally cured in order to form stable dielectric layers from the spin-on-polymer (SOP) dielectric materials.

The magnitude of the dielectric constant as well as the stability of the physical and chemical properties of the spin-on-polymer (SOP) dielectric layer are often determined by the degree of polymerization and the amount of H2O and —OH in the polymer dielectric layer. Conventional curing processes for organic polymer dielectric layers as are employed in the art of microelectronics fabrication employ elevated temperatures and often a vacuum environment (i. e. sub-atmospheric pressure) to facilitate these objectives Although desirable for having relatively lower dielectric constant values, spin-on-polymer (SOP) dielectric materials which are employed for forming spin-on-polymer (SOP) dielectric layers in microelectronics fabrications are not without problems. In particular, curing of spin-on-polymer (SOP) dielectric layers often results in variable dimensional and mechanical changes of SOP layers, which dimensional and mechanical changes are often significant and difficult to control, particularly if subsequent processing of the microelectronics fabrication within which such spin-on-polymer (SOP) dielectric layers are employed requires additional exposure to conditions where additional changes similar to those experienced in curing of the polymer dielectric layer can take place. Likewise, degradative changes in physical and chemical properties of low dielectric constant dielectric layers employed within microelectronics fabrications during the service life usage of such fabrications is particularly troublesome if such tendency towards further change is not attenuated.

It is therefore towards the goal of forming within microelectronics fabrications low dielectric constant dielectric layers formed from spin-on-polymer (SOP) dielectric materials, while forming the low dielectric constant dielectric layers with stabilized physical and chemical properties, that the present invention is more generally directed.

Various methods and associated microelectronics structures have been disclosed within the art of microelectronics fabrication for formings upon and around patterned microelectronics conductor layers low dielectric constant organic polymer dielectric layers within microelectronics fabrications.

For example, Havemann, in U.S. Pat. No. 5,565,384, discloses a self-aligned method for forming an interconnection via through a blanket silicon containing dielectric layer, to access a patterned conductor layer having formed disposed between and around its pattern a low dielectric constant dielectric layer. The blanket low dielectric constant dielectric layer is formed from an organic polymer spin-on-polymer (SOP) dielectric material which functions as an etch stop layer for plasma etching, as well as constituting a low dielectric constant dielectric material for forming the low dielectric constant dielectric layer within a microelectronics fabrication.

Further, Chang, in U.S. Pat. No. 5,559,055, discloses a method for forming low dielectric constant dielectric layers disposed between and around patterns of patterned microelectronics conductor layers within a microelectronics fabrication. The method employs selective subtractive etch of a conventional silicon containing interlevel dielectric layer to provide an air gap which may optionally be backfilled with spinon-polymer (SOP) dielectric material. This result is achieved with air gap (dielectric constant 1.0) or alternatively with organic polymer material (dielectric constant from about 2.2 to about 3.4) to reduce capacitance and hence the resistance-capacitance (RC) time constant resulting in faster device speed.

Desirable in the art of microelectronics fabrication are additional methods and materials which may be employed for forming a dielectric layer with a relatively low dielectric constant disposed between and around a patterned microelectronics conductor layer within a microelectronics fabrication, where the low dielectric constant dielectric layer is cured so as to be able to withstand subsequent processing as is conventional in the state of the art of microelectronics fabrication without substantial alteration of dimensions and other physical and chemical properties.

It is towards the foregoing goals that the present invention is both generally and more specifically directed.

SUMMARY OF THE INVENTION

A first object of the present invention is to provide a method through which a low dielectric constant dielectric layer may be formed upon a substrate within a microelectronics fabrication.

A second object of the present invention is to provide a method in accord with the first object of the present invention, where there is employed an organic polymer spin-on-polymer (SOP) dielectric material to form the low dielectric constant dielectric layer upon the substrate within the microelectronics fabrication.

A third object of the present invention is to provide a method in accord with the first object of the present invention or the second object of the present invention, where the organic polymer spin-on-polymer (SOP) dielectric material employed to form the low dielectric constant dielectric layer is cured by employing a method which stabilizes its dimensions and physical and chemical properties.

A fourth object of the present invention is to provide a method in accord with the first object of the present invention, the second object of the present invention and/or the third object of the present invention, which method is readily commercially implemented.

In accord with the objects of the present invention, there is provided by the present invention a method for forming from a spin-on-polymer (SOP) dielectric material formed over a substrate within a microelectronics fabrication a low dielectric constant dielectric layer. To practice the method of the present invention, there is first provided a substrate. There is then formed over the substrate a dielectric layer formed of a spin-on-polymer (SOP) dielectric material, the spin-on-polymer (SOP) dielectric material being susceptible to greater shrinkage when thermally cured at sub-atmospheric pressure than when thermally cured at atmospheric pressure. There is then thermally cured the dielectric layer at atmospheric pressure to form an atmospheric pressure thermally cured dielectric layer with attenuated shrinkage in comparison with a sub-atmospheric pressure thermally cured dielectric layer. Finally, there is thermally processed the atmospheric pressure thermally cured dielectric layer at sub-atmospheric pressure to form a sub-atmospheric pressure thermally processed atmospheric pressure thermally cured dielectric layer with attenuated shrinkage in comparison with a sub-atmospheric pressure thermally processed sub-atmospheric pressure thermally cured dielectric layer.

The present invention provides a method through which there may be formed upon a substrate employed within a microelectronics fabrication a low dielectric constant dielectric layer formed employing spin-on-polymer (SOP) dielectric material with stabilized dimensions and physical and chemical properties. The present invention realizes this object by thermally curing the spin-on-polymer (SOP) low dielectric constant dielectric layer at an elevated temperature at or below atmospheric pressure to achieve the desired stability of dimensions and other physical and chemical properties.

The method of the present invention is readily commercially implemented. The method of the present invention employs methods and materials as are generally known in the art of microelectronics fabrication. Since it is a novel ordering of methods, materials and process limits which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The present invention provides a method for forming, while employing a spin-on-polymer (SOP) low dielectric constant dielectric material upon a substrate a dielectric layer which upon curing at atmospheric pressure at elevated temperature is stabilized with respect to the physical, chemical and dielectric properties of the low dielectric constant dielectric layer such that there is attenuated a sensitivity towards further chances in those properties incident to subsequent microelectronics fabrication processing steps and service usage conditions. The method realizes this result by atmospheric pressure processing to cure the dielectric layer followed by sub-atmospheric pressure processing which is typical of microelectronics fabrication processing. The method of the invention may be practiced in microelectronics fabrications including but not limited to integrated circuit microelectronics fabrications, charge coupled device microelectronics fabrications, solar cell microelectronics fabrications, ceramic substrate microelectronics fabrications and flat panel display microelectronics fabrications.

The present invention provides a method for forming a dielectric layer upon a substrate within a microelectronics fabrication employing a dielectric material including but not limited to organic polymer spin-on-polymer (SOP) dielectric materials, siloxane spin-on-glass (SOG) dielectric materials and silsesquioxane spin-on-glass (SOG) dielectric materials.

First Preferred Embodiment

Figure 1:
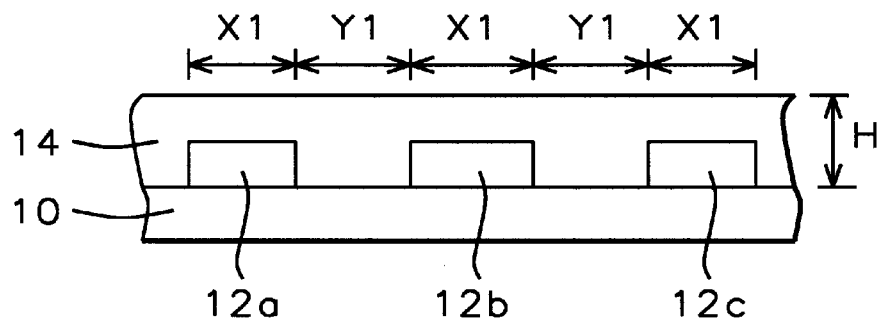
FIG. 1, FIG. 2 and FIG. 3 are directed towards a general embodiment of the present invention which constitutes a first preferred embodiment of the present invention. Shown in FIG. 1 to FIG. 3 are a series of schematic cross-sectional diagrams illustrating the results of forming upon a substrate employed within a microelectronics fabrication a low dielectric constant dielectric layer employing a spin-on-polymer (SOP) low dielectric constant dielectric material which is subsequently cured at atmospheric pressure at elevated temperature to stabilize physical and chemical properties and attenuate a sensitivity to subsequent dimensional or physical and chemical changes upon sub-atmospheric pressure thermal processing, in accord with a general embodiment of the present invention.
Figure 2:
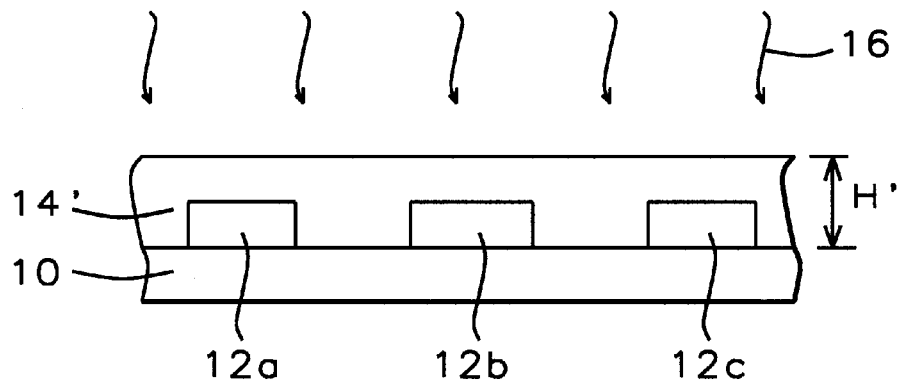
Figure 3:
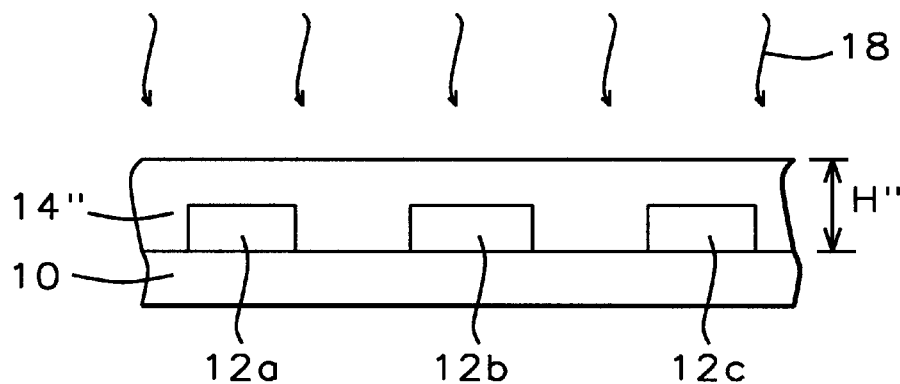

Referring now to FIG. 1 to FIG. 3, there is shown a series of schematic cross-sectional diagrams illustrating the results of forming within a microelectronics fabrication upon a substrate in accord with a general embodiment of the present invention which constitutes a first preferred embodiment of the present invention a dielectric layer employing a spin-on-polymer (SOP) low dielectric constant dielectric material which is cured to stabilize the physical, chemical and dielectric properties of the low dielectric constant dielectric layer such that there is an attenuation of a sensitivity of the physical, chemical and dielectric properties of the low dielectric constant dielectric layer to further changes of those properties incident to subsequent microelectronics fabrication steps and service usage conditions. Shown in FIG. is a schematic cross-sectional diagram of the dielectric layer upon a substrate at an early stage in fabrication.

Shown in FIG. 1 is a substrate 10 employed within a microelectronics fabrication, where the substrate 10 has formed upon it a series of patterned layers 12a, 12b and 12c comprising a patterned microelectronics layer. Formed over and around the patterned microelectronics layer is a blanket low dielectric constant dielectric layer 14. The blanket low dielectric constant dielectric layer 14 is formed to a thickness of H over the substrate 10.

Within the first preferred embodiment of the present invention, the substrate 10 may be a substrate employed within a microelectronics fabrication selected from the group including but not limited to integrated circuit microelectronics fabrications, charge coupled device microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication. Or in the alternative, the substrate 10 may be the substrate employed within the microelectronics fabrication, where the substrate has any of several additional microelectronics substrate layers formed thereupon or thereover. Such additional microelectronics substrate layers (similarly with the substrate 10 itself) may include, but are not limited to microelectronics conductor substrate layers, microelectronics semiconductor substrate layers and microelectronics dielectric substrate layers.

With respect to the series of patterned layers 12a, 12b and 12c which comprises a patterned microelectronics layer upon the substrate 10, the series of patterned microelectronics layers 12a, 12b and 12c may be formed from a group including but not limited to microelectronics conductor layers, microelectronics semiconductor layers and microelectronics dielectric layers. Methods for forming patterned microelectronics layers include but are not limited to thermal assisted evaporation methods, electron beam evaporation methods, chemical vapor deposition (CVD) methods and physical vapor deposition (PVD) sputtering methods, in conjunction with photolithographic and etching methods as are conventional in the art of microelectronics fabrication.

Within the first preferred embodiment of the present invention, the series of patterned microelectronics layers 12a, 12b and 12c comprising the patterned microelectronics layer is preferably formed from aluminum containing material employing the method of thermal assisted evaporation. Preferably, the linewidths X1 and the line separations Y1 are typically those which are conventionally formed in the art of photolithographic pattern formation practiced in microelectronics fabrication.

With respect to the blanket low dielectric constant dielectric layer 14, the blanket low dielectric constant dielectric 14 may be formed from any of several types of low dielectric constant spin-on-polymer (SOP) dielectric materials as are known in the art of microelectronics fabrication, including but not limited to polyimide spin-on-polymer (SOP) dielectric material, poly (arylene ether) spin-on-polymer (SOP) dielectric material and poly (fluorinated arylene ether) spin-on-polymer (SOP) dielectric material. Preferably, the thickness H of the blanket low dielectric constant dielectric layer 14 is typically within the thickness range as is conventionally formed by the spin-on methods and materials employed within the art of microelectronics fabrication.

Referring now to FIG. 2, there is shown a schematic cross-sectional diagram illustrating results of further processing of the microelectronics fabrication whose schematic cross-sectional diagram is shown in FIG. 1. Shown in FIG. 2 is a schematic cross-sectional diagram of a microelectronics fabrication otherwise equivalent to the microelectronics fabrication shown in FIG. 1, but wherein the spin-on-polymer (SOP) low dielectric constant dielectric layer 14 is thermally cured by processing at atmospheric pressure in a thermal annealing environment 16 to form an atmospheric pressure cured low dielectric constant dielectric layer 14' of thickness H'. In accord with the method of the present invention, it has been determined experimentally that atmospheric pressure thermal annealing results in lower shrinkage of the low dielectric constant dielectric layer 14 than does sub-atmospheric pressure thermal annealing of the low dielectric constant dielectric layer 14.

Within the preferred first embodiment of the present invention, the curing of the spin-on-polymer (SOP) low dielectric constant dielectric layer 14 is preferably carried out at atmospheric pressure at an elevated temperature of from about 350 degrees to about 450 degrees centigrade for a period of time of from about 10 minutes to about 120 minutes.

With respect to the first preferred embodiment of the present invention, the low dielectric constant dielectric layer 14 is preferably formed employing methods as are conventional in the art of microelectronics fabrication employing materials as are conventional in the art of microelectronics fabrication. Preferably, the organic polymer spin-on-polymer(SOP) low dielectric constant dielectric material employed is a poly (arylene ether) spin-on-polymer known as Pae-2.0, which is commercially available from Schumacher Corporation. Alternately, a preferred spin-on-polymer (SOP) dielectric material for forming a low dielectric constant dielectric layer 14 is a fluorinated poly (arylene ether) known as FLARE 2.0, available commercially from Allied Signal Corporation. Still another alternative spin-on-polymer (SOP) dielectric material preferred for forming the low dielectric constant dielectric layer 14 is known as Silk, available from Dow Chemical Company, Midland, Mich., U.S.A.

Referring now to FIG. 3, there is shown a schematic cross-sectional diagram illustrating the results of further processing of the microelectronics fabrication whose schematic cross-sectional diagram is shown schematically in FIG. 2. Shown in FIG. 3 is a schematic cross-sectional diagram of a microelectronics fabrication otherwise equivalent to the microelectronics fabrication whose schematic cross-sectional diagram is shown in FIG. 2, but wherein the thermally cured low dielectric constant dielectric layer 14' has been thermally processed within a thermal annealing environment 18 to form a thermally processed thermally cured low dielectric constant dielectric layer 14". Further processing of the microelectronics fabrication has resulted in an attenuated further change in the properties of the low dielectric constant layer 14", such as an attenuated further shrinkage of the thickness H" from the initial cured thickness of H' of the low dielectric constant dielectric layer 14'. FIG. 3 shows the results of a second thermal annealing at sub-atmospheric pressure environment 18 typical of microelectronics fabrication processing. The first thermal annealing step at atmospheric pressure followed by the second thermal annealing step at atmospheric pressure or sub-atmospheric pressure provides reduced shrinkage and improved physical properties of the low dielectric constant dielectric layer than would be the case for sub-atmospheric pressure thermal annealing followed by atmospheric pressure thermal annealing.

Second Preferred Embodiment

Figure 4:
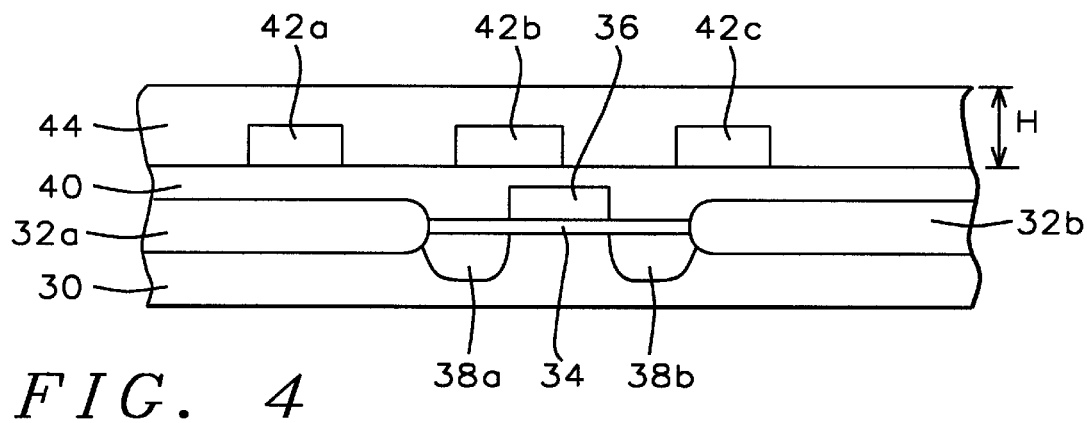
FIG. 4, FIG. 5 and FIG. 6 are directed towards a more specific embodiment of the present invention which constitutes a second preferred embodiment of the present invention. Shown in FIG. 4 to FIG. 6 is a series of schematic cross-sectional diagrams illustrating the results of forming upon a semiconductor substrate employed within an integrated circuit microelectronics fabrication a low dielectric constant dielectric layer which is subsequently cured at atmospheric pressure at elevated temperature to stabilize physical and chemical properties and attenuate a sensitivity to subsequent dimensional or physical and chemical changes upon sub-atmospheric pressure thermal processing, in accord with the second preferred embodiment of the present invention.
Figure 5:
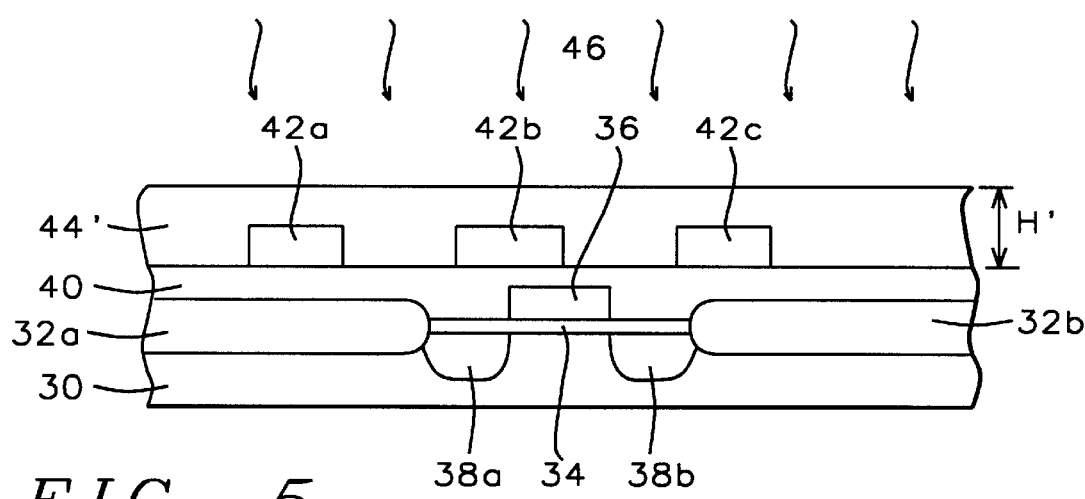
Figure 6:
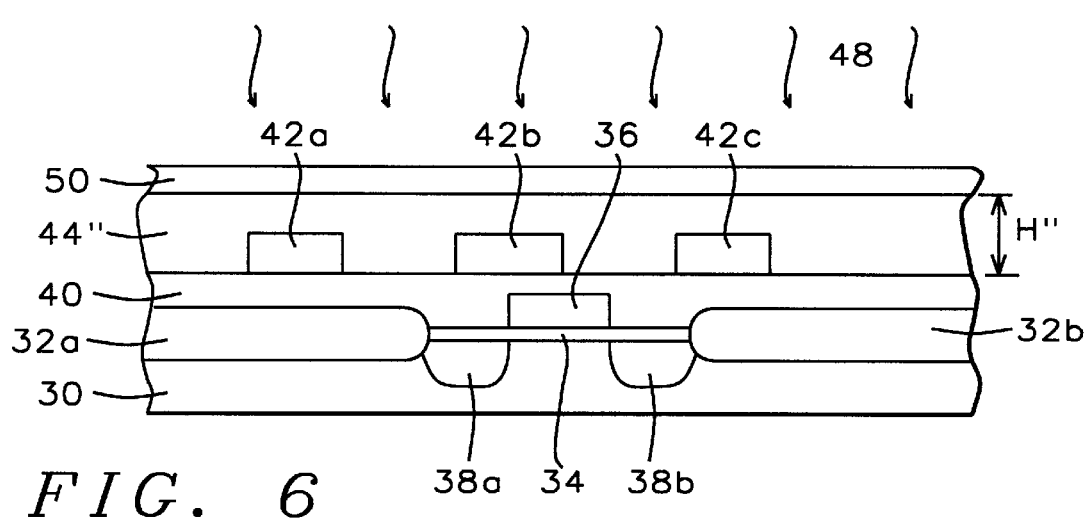

Referring now to FIG. 4 to FIG. 6, there is shown a series of schematic cross-sectional diagrams illustrating the results of forming upon a substrate employed within a semiconductor integrated circuit microelectronics fabrication in accord with a more specific embodiment of the present invention which comprises a second preferred embodiment of the present invention a dielectric layer formed from a spinon-polymer (SOP) low dielectric constant dielectric material which is cured to stabilize the physical, chemical and dielectric properties of the dielectric layer so as to attenuate further changes in such physical, chemical and dielectric properties of the dielectric layer when the integrated circuit microelectronics fabrication is subjected to subsequent microelectronics fabrication processing steps as are conventional in the art, and to subsequent usage conditions. Shown in FIG. 4 is a schematic cross-sectional diagram of the semiconductor integrated circuit microelectronics fabrication at an early stage in its fabrication in accord with the method of the present invention.

Shown in FIG. 4 is a semiconductor substrate 30 having formed within and upon its surface a pair of isolation regions 32a and 32b which defines an active region of the semiconductor substrate 30. Although semiconductor substrates are known in the art of semiconductor integrated circuit fabrication with either dopant polarity, several dopant concentrations and various crystallographic orientations, for the second preferred embodiment of the present invention, the semiconductor substrate 30 is preferably a (100) silicon semiconductor substrate having an N- or P-type doping.

Similarly, although it is also known in the art of semiconductor integrated circuit microelectronics fabrication that isolation regions may be formed within and upon semiconductor substrates while employing methods including but not limited to isolation region thermal growth methods and isolation region deposition/patterning methods, for the second preferred embodiment of the present invention the isolation regions 32a and 32b are preferably formed within and upon the semiconductor substrate 30 while employing an isolation thermal growth method at a temperature of from about 350 degrees to about 400 degrees centigrade to form within and upon the semiconductor substrate 30 the pair of isolation regions 32a and 32b of silicon oxide.

Shown also within FIG. 4 formed within and upon the active region of the semiconductor substrate 30 is a field effect transistor (FET) which comprises a series of structures including: (1) a gate dielectric layer 34 formed upon the active region of the semiconductor substrate 30, the gate dielectric layer having been formed and aligned thereupon; (2) a gate electrode 36; and (3) a pair of source/drain regions 38a and 38b formed within the active region of the semiconductor substrate 30 at areas not covered by the gate dielectric layer 34 and the gate electrode 36. Each of the structures within the series of structures which comprises the field effect transistor (FET) may be formed employing methods and materials which are conventional in the art of field effect transistor (FET) fabrication.

For example, although it is known in the art of field effect transistor (FET) fabrication that gate dielectric layers may be formed through patterning, employing methods as are conventional in the art, of blanket gate dielectric layers formed upon active regions of semiconductor substrates employing methods including but not limited to blanket gate dielectric layer thermal growth methods and blanket gate dielectric layer deposition/patterning methods, for the second preferred embodiment of the present invention the blanket gate dielectric layer 34 is preferably formed through patterning, employing methods as are conventional in the art of a blanket gate dielectric layer formed employing a blanket gate dielectric layer thermal growth method to form the blanket gate dielectric layer 34 of silicon oxide upon the active region of the semiconductor substrate 30.

Similarly, although it is known in the art of field effect transistor (FET) fabrication that gate electrodes may be formed through patterning, employing methods as are conventional in the art, of blanket gate electrode material layers formed of gate electrode materials including but not limited to metals, metal alloys, doped polysilicon or polycides (doped polysilicon/metal silicide stacks), for the second preferred embodiment of the present invention the gate electrode 36 is preferably formed through patterning, employing methods as are conventional in the art, of a blanket layer of a doped polysilicon or a polycide gate electrode material formed upon the blanket gate dielectric layer.

Finally, it is also known in the art of field effect transistor (FET) fabrication that source/drain regions are typically formed into active regions of a semiconductor substrate employing ion implantation methods which employ dopant ions of polarity opposite the polarity of the semiconductor substrate within which is formed those source/drain regions. For the second preferred embodiment of the present invention, the source/drain regions 38a and 38b are preferably formed within the active region of the semiconductor substrate 30 employing a high dose ion implant while employing at least the gate electrode 36 and the gate dielectric layer 34 as an ion implantation mask. The high dose implant is of polarity appropriate to the field effect transistor (FET) and the semiconductor substrate 30.

There is also shown within FIG. 4 formed over the semiconductor substrate 30 and the series of structures which forms the field effect transistor (FET) a planarized pre-metal dielectric (PMD) layer 40. Methods and materials through which planarized pre-metal dielectric (PMD) layers may be formed within integrated circuit fabrications are known in the art of microelectronics fabrications. Planarized pre-metal dielectric (PMD) layers may be formed within microelectronics fabrications employing methods including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed planarized pre-metal dielectric (PMD) layers of dielectric materials including but not limited to silicon oxide dielectric materials, silicon nitride dielectric materials and silicon oxynitride dielectric materials. For the second preferred embodiment of the present invention, the planarized pre-metal dielectric (PMD) layer 40 is preferably formed of a silicon oxide dielectric material deposited employing a plasma enhanced chemical vapor deposition (PECVD) method and subsequently planarized employing a chemical mechanical polish (CMP) planarizing method, as is common in the art of integrated circuit microelectronics fabrication. Other materials and methods may, however, also be employed in forming the planarized pre-metal dielectric (PMD) layer 40. Preferably The planarized pre-metal dielectric (PMD) layer is formed to a thickness of from about 6000 to about 12000 angstroms over the semiconductor substrate 30 and the series of structures which forms the field effect transistor (FET).

There is also shown in FIG. 4 formed upon the planarized pre-metal dielectric (PMD) layer 40 a series of patterned conductor layers 42a, 42b and 42c which comprise a patterned microelectronics conductor layer. Methods and materials through which patterned conductor layers are typically formed within integrated circuit microelectronics fabrications are known in the art of integrated circuit microelectronics fabrication. Patterned conductor layers are typically formed within integrated circuit microelectronics fabrications employing methods including but not limited to thermally assisted evaporation methods, electron beam assisted evaporation methods, chemical vapor deposition (CVD) methods and physical vapor deposition (PVD) sputtering methods, in conjunction with photolithographic and etching methods, through which may be formed patterned conductor layers of conductor materials including but not limited to metals, metal alloys, highly doped polysilicon and polycides (highly doped polysilicon/metal silicide stacks) conductor layers. For the second preferred embodiment of the present invention, the patterned conductor layers 42a, 42b and 42c are each preferably formed from an aluminum containing conductor material. Preferably, each patterned conductor layer within the series of patterned conductor layers 42a, 42b and 42c is preferably formed to, and separated by, dimensions analogous or equivalent to the dimensions employed when forming and separating the series of patterned microelectronics layers 12a, 12b and 12c within the first preferred embodiment of the present invention as illustrated within the schematic cross-sectional diagram of FIG. 1.

Finally, there is shown in FIG. 4 formed upon the planarized pre-metal dielectric layer 40 and the series of patterned conductor layers 42a, 42b and 42c a low dielectric constant dielectric layer 44 formed employing a low dielectric constant spin-on-polymer (SOP) dielectric material. The low dielectric constant dielectric layer 44 is formed employing methods, materials and dimensions analogous or equivalent to the methods. materials and dimensions employed for forming the low dielectric constant dielectric layer 14 employed in the microelectronics fabrication whose schematic cross-sectional diagram is illustrated in FIG. 1.

Referring now to FIG. 5, there is shown a schematic cross-sectional diagram illustrating the results of further processing of the integrated circuit microelectronics fabrication whose schematic cross-sectional diagram is shown in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is shown in FIG. 4, but wherein the low dielectric constant dielectric layer is thermally cured within a thermal annealing atmosphere 46 to form a thermally cured low dielectric constant dielectric layer 44'. Within the second preferred embodiment of the present invention, the first thermal annealing atmosphere is employed at atmospheric pressure to reduce shrinkage and stabilize the physical and chemical properties of the low dielectric constant dielectric layer 44.

Within the preferred second embodiment of the present invention, the thermally cured low dielectric constant dielectric layer 44' is preferably formed employing materials, methods and dimensions analogous or equivalent to the materials, methods and dimensions employed in forming the thermally cured low dielectric constant dielectric layer 14' within the first preferred embodiment of the present invention as illustrated within the schematic cross-sectional diagram of FIG. 2.

With respect to the second preferred embodiment of the present invention, the thermally cured low dielectric constant dielectric layer 44, is preferably cured employing a process analogous or equivalent to the curing process of the cured organic polymer low dielectric constant dielectric layer 14' shown in the schematic cross-sectional diagram of the microelectronics fabrication illustrated in FIG. 2.

Referring now to FIG. 6, there is shown a schematic cross-sectional diagram illustrating the results of further processing of the integrated circuit microelectronics fabrication whose schematic cross-sectional diagram is shown in FIG. 5. Shown in FIG. 6 is a schematic cross-sectional diagram of an integrated circuit microelectronics fabrication otherwise equivalent to the integrated circuit microelectronics fabrication shown in Fig. 5, but wherein there has been formed over and upon the thermally cured low dielectric constant dielectric layer 44' a silicon containing dielectric layer 50 which forms a cap layer thermally processed over the thermally cured low dielectric constant dielectric layer 44'' formed from the thermally cured low dielectric constant dielectric layer 44'.

With respect to the silicon containing dielectric cap layer 50 shown in FIG. 6, the silicon containing dielectric cap layer 50 may be formed employing methods as are conventional in the art of semiconductor integrated circuit microelectronics fabrication. Such methods include but are not limited to plasma enhanced chemical vapor deposition (PECVD) and sub-atmospheric pressure thermal chemical vapor deposition (SACVD). Preferably, the methods employed to form the silicon containing dielectric cap layer 50 provide a sub-atmospheric pressure thermal annealing environment 48.

EXAMPLES

The benefits and improvements of the present invention are illustrated by examples of the attenuation of the further changes in the physical, chemical and dielectric properties of the low dielectric constant dielectric layers formed employing low dielectric constant spin-on polymer (SOP) dielectric materials and cured at atmospheric pressure at elevated temperature, as compared to methods of curing as are more conventionally employed in the art of microelectronics fabrication.

A series of spin-on-polymer (SOP) low dielectric constant dielectric layers formed on silicon semiconductor substrates employing SOP dielectric materials commercially known as PAE-2 and FLARE supplied respectively by Schumacher and Allied Sigrnal Corporation. After curing, one such set of dielectric layer experimental samples prepared in accord with the method of the present invention, the thickness and mechanical stress of the dielectric layer samples were measured and compared with a second set of dielectric layer samples which were otherwise equivalent but wherein the curing method was a conventional vacuum curing process known in the art of organic polymer spin-on-polymer dielectric layer fabrication. The results are shown in Table I.

TABLE I

Change in Thickness and Stress for Dielectric Layers Upon Annealing (425 deg C.)

|  | Layer Thickness Vacuum Anneal T 425 C. | Layer Thickness Vacuum Anneal T 420 C. | Layer Thickness Atmos Anneal T 425 C. | Stress Vacuum Anneal | Stress Atmos Anneal |
|---|---|---|---|---|---|
| | | | Spin-on-polymer: PAE-2 | | |
| Initial | 10128 A | 10162 A | 9924 A | 4.158 e + 08 | 4.278 e + 08 |
| 12 hrs | 9730 A | 9518 A | 9726 A | 4.501 e + 08 | 4.404 e + 08 |
| Change | −3.93% | −6.34% | −2.00% | +8.25% | +2.94% |
| | | | Spin-on-polymer: FLARE | | |
| Initial | 8096 A | — | 9645 A | 4.830 e + 08 | 4.982 e + 08 |
| 12 hrs | 7313 A | — | 8796 A | 5.774 e + 08 | 5.742 e + 08 |
| Change | −9.67% | — | −8.80% | +19.54% | +15.25% |

The experimental results shown in Table I for shrinkage of layer thickness and increase in tensile stress for spin-on-polymer (SOP) dielectric layers demonstrate that less shrinkage and less tensile stress increase are found in samples formed and cured in accord with the method of the present invention than for samples thermally processed in the more conventional manner. This is particularly so for the poly (arylene ether) spin-on-polymer (SOP) known commercially by the designation as PAE-2.0 manufactured by Schumacher. Since the shrinkage and tensile stress are directly related in that increased shrinkage causes increased tensile stress, an attenuation in shrinkage as well as other physical and chemical properties of the polymer dielectric layer which results when atmospheric pressure annealing is employed is beneficial in reducing cracking and adhesion failure in the typical microelectronics fabrications within which spin-on-polymer (SOP) low dielectric constant dielectric layers are employed.

Further experimental results were obtained from measurements of the line-to-line capacitance of patterned conductor layers on substrates over which were formed the low dielectric constant spin-on-polymer (SOP) dielectric layers. The capacitance of samples formed and cured in accord with the method of the present invention were compared with the capacitance of similar samples otherwise equivalent, but wherein the curing method employed was a conventional vacuum curing method as is known and practiced in the art of microelectronics fabrication. The results are shown in Table II.

TABLE II

Change in Line-Line Capacitance With SOP Dielectric Layer 425 deg C. Anneal

| SOP | Vacuum Anneal, mmF | Atmospheric Anneal, mmF | Change |
|---|---|---|---|
| PAE-2.0 | 0.77 | 0.75 | 2.7% |
| FLARE | 0.84 | 0.79 | 6.1% |

The results shown in Table II demonstrate a lower capacitance for the samples cured and annealed at atmospheric pressure in accord with the method of the present invention; hence the dielectric constant of the organic polymer dielectric layer between the conductor lines must therefore also be lower for the dielectric layer samples cured at atmospheric pressure compared to the dielectric constant of otherwise equivalent dielectric layers but wherein the curing method was the conventional vacuum curing method known in the art of microelectronics fabrication.

As is understood by a person skilled in the art, the preferred embodiments and examples of the present invention are illustrative of the present invention rather than limiting of the present invention. Revisions and modifications may be made to methods, materials, structures and dimensions through which may be formed microelectronics fabrications and semiconductor integrated circuit microelectronics fabrications having formed therein and within dielectric layers formed in accord with the method of the present invention, as defined by the appended claims.

What is claimed is:

1. A method for forming a dielectric layer upon a substrate employed within a microelectronics fabrication comprising:

providing a substrate;

forming over the substrate a dielectric layer formed of a spin-on-polymer (SOP) dielectric material, the spin-on-polymer (SOP) dielectric material being susceptible to greater shrinkage when thermally processed at sub-atmospheric pressure than when thermally processed at atmospheric pressure; the SOP dielectric material comprised of a material selected from the group comprising poly (arylene ether) and fluorinated poly (arylene ether);

thermally processing the dielectric layer at atmospheric pressure to form an atmospheric pressure thermally processed dielectric layer with attenuated shrinkage in comparison with a sub-atmospheric pressure thermally processed dielectric layer; the thermal processing being conducted at a temperature from about 350 to 450° C. for from about 10 to 120 minutes; and thermally processing the atmospheric pressure thermally processed dielectric layer at a sub-atmospheric pressure to form a sub-atmospheric pressure thermally processed atmospheric pressure thermally processed dielectric layer with attenuated shrinkage in comparison with an atmospheric pressure thermally processed sub-atmospheric pressure thermally processed dielectric layer.

2. The method of claim 1 wherein the dielectric layer is formed upon a microelectronics fabrication chosen from the group consisting of:
 integrated circuit microelectronics fabrications;
 charge coupled device microelectronics fabrications;
 solar cell microelectronics fabrications;
 ceramic substrate microelectronics fabrications; and
 flat panel display microelectronics fabrications.

3. A method for forming within an integrated circuit microelectronics fabrication a dielectric layer comprising:
 providing a semiconductor substrate;
 forming over the semiconductor substrate a patterned microelectronics layer;
 forming upon the patterned microelectronics layer a dielectric layer employing a poly (arylene ether) spin-on material; and
 thermally annealing the dielectric layer at a temperature from about 350 to 450° C. for from about 10 to 120 minutes at atmospheric pressure to stabilize the physical and chemical properties of the low dielectric constant dielectric layer so as to attenuate shrinkage due to further thermal annealing at sub-atmospheric pressure.

4. The method of claim 3 wherein the semiconductor substrate is a silicon semiconductor substrate.

5. The method of claim 3 wherein the patterned microelectronics layer is a patterned conductor layer.

6. The method of claim 1, wherein
 the sub-atmospheric pressure thermally processed atmospheric pressure thermally processed poly (arylene ether) dielectric layer having a shrinkage of about 2.00%, and about a 2.7% decrease in change in line-line capacitance and about a 5.31% decrease in stress variation compared to an atmospheric pressure thermally processed sub-atmospheric pressure thermally processed poly (arylene ether) dielectric layer; and
 the sub-atmospheric pressure thermally processed atmospheric pressure thermally processed fluorinated poly (arylene ether) dielectric layer having a shrinkage of about 8.80%, and about a 6.1% decrease in change in line-line capacitance and about a 4.29% decrease in stress variation compared to an atmospheric pressure thermally processed sub-atmospheric pressure thermally processed fluorinated poly (arylene ether) dielectric layer.

7. The method of claim 3, wherein the sub-atmospheric pressure thermally processed atmospheric pressure thermally processed poly (arylene ether) dielectric layer having a shrinkage of about 2.00%, and about a 2.7% decrease in change in line-line capacitance and about a 5.31% decrease in stress variation compared to an atmospheric pressure thermally processed sub-atmospheric pressure thermally processed poly (arylene ether) dielectric layer.

8. A method for forming a dielectric layer upon a substrate employed within a microelectronics fabrication comprising:
 providing a substrate; p1 forming over the substrate a dielectric layer formed of a spin-on-polymer (SOP) dielectric material, the spin-on-polymer (SOP) dielectric material being susceptible to greater shrinkage when thermally processed at sub-atmospheric pressure than when thermally processed at atmospheric pressure; the SOP comprised of a material selected from the group comprising poly (arylene ether) and fluorinated poly (arylene ether);
 thermally processing the dielectric layer at atmospheric pressure to form an atmospheric pressure thermally processed dielectric layer with attenuated shrinkage in comparison with a sub-atmospheric pressure thermally processed dielectric layer; the thermal processing being conducted at a temperature from about 350 to 450° C. for from about 10 to 120 minutes; and
 thermally processing the atmospheric pressure thermally processed dielectric layer at a sub-atmospheric pressure to form a sub-atmospheric pressure thermally processed atmospheric pressure thermally processed dielectric layer with attenuated shrinkage in comparison with an atmospheric pressure thermally processed sub-atmospheric pressure thermally processed dielectric layer;
 the sub-atmospheric pressure thermally processed atmospheric pressure thermally processed poly (arylene ether) dielectric layer having a shrinkage of about 2.00%, and about a 2.7% decrease in change in line-line capacitance and about a 5.31% decrease in stress variation compared to an atmospheric pressure thermally processed sub-atmospheric pressure thermally processed poly (arylene ether) dielectric layer;
 the sub-atmospheric pressure thermally processed atmospheric pressure thermally processed fluorinated poly (arylene ether) dielectric layer having a shrinkage of about 8.80%, and about a 6.1% decrease in change in line-line capacitance and about a 4.29% decrease in stress variation compared to an atmospheric pressure thermally processed sub-atmospheric pressure thermally processed fluorinated poly (arylene ether) dielectric layer.

9. The method of claim 13 wherein the dielectric layer is formed upon a microelectronics fabrication chosen from the group consisting of:
 integrated circuit microelectronics fabrications,
 charge coupled device microelectronics fabrications,
 solar cell microelectronics fabrications,
 ceramic substrate microelectronics fabrications, and
 flat panel display microelectronics fabrications.

\* \* \* \* \*